(12) United States Patent
Xie et al.

(10) Patent No.: US 11,355,726 B2
(45) Date of Patent: Jun. 7, 2022

(54) FLEXIBLE DISPLAY PANEL, METHOD OF MANUFACTURING FLEXIBLE DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fuzheng Xie, Beijing (CN); Xiaoxia Liu, Beijing (CN); Binfeng Feng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 209 days.

(21) Appl. No.: 16/622,769

(22) PCT Filed: Apr. 1, 2019

(86) PCT No.: PCT/CN2019/080769
§ 371 (c)(1),
(2) Date: Dec. 13, 2019

(87) PCT Pub. No.: WO2019/228057
PCT Pub. Date: Dec. 5, 2019

(65) Prior Publication Data
US 2020/0335718 A1 Oct. 22, 2020

(30) Foreign Application Priority Data
Jun. 1, 2018 (CN) .......................... 201810558433.7

(51) Int. Cl.
*H01L 51/52* (2006.01)
*H01L 51/56* (2006.01)

(52) U.S. Cl.
CPC .......... *H01L 51/5237* (2013.01); *H01L 51/56* (2013.01)

(58) Field of Classification Search
CPC ... H01L 51/5237; H01L 51/56; H01L 51/003; H01L 51/0097; Y02P 70/50; Y02E 10/549; G09F 9/301
See application file for complete search history.

(56) References Cited

U.S. PATENT DOCUMENTS

2014/0183473 A1  7/2014  Lee et al.
2014/0217382 A1  8/2014  Kwon et al.
(Continued)

FOREIGN PATENT DOCUMENTS

CN   104821294 A   8/2015
CN   105989783 A   10/2016
(Continued)

*Primary Examiner* — Kyoung Lee
(74) *Attorney, Agent, or Firm* — Muncy, Geissler, Olds & Lowe, P.C.

(57) ABSTRACT

A flexible display panel, a method of manufacturing the flexible display panel and a display device are provided. The method of manufacturing the flexible display panel includes: providing a flexible film, wherein the flexible film includes a first region and a second region other than the first region; forming an adhesive on the second region of the flexible film; attaching a flexible display substrate to the flexible film by using the adhesive; cutting the flexible film to remove at least a portion of the first region of the flexible film, wherein the flexible film is configured to support the flexible display substrate.

14 Claims, 6 Drawing Sheets

(56) References Cited

U.S. PATENT DOCUMENTS

| | | | |
|---|---|---|---|
| 2015/0036300 A1 | 2/2015 | Park et al. | |
| 2015/0263300 A1 | 9/2015 | Namkung et al. | |
| 2015/0382446 A1 | 12/2015 | Kwon et al. | |
| 2016/0275830 A1 | 9/2016 | You et al. | |
| 2017/0133411 A1 | 5/2017 | Xie et al. | |
| 2017/0179423 A1 | 6/2017 | Kwon et al. | |
| 2017/0352834 A1* | 12/2017 | Kim | G02F 1/133305 |
| 2018/0315804 A1 | 11/2018 | Li et al. | |

FOREIGN PATENT DOCUMENTS

| | | |
|---|---|---|
| CN | 106847870 A | 6/2017 |
| CN | 106887186 A | 6/2017 |
| CN | 106910428 A | 6/2017 |
| CN | 107195802 A | 9/2017 |
| CN | 107425142 A | 12/2017 |
| CN | 107464878 A | 12/2017 |
| CN | 108054192 A | 5/2018 |
| CN | 108766243 A | 11/2018 |

\* cited by examiner

FLEXIBLE DISPLAY PANEL, METHOD OF MANUFACTURING FLEXIBLE DISPLAY PANEL AND DISPLAY DEVICE

CROSS-REFERENCE TO RELATED APPLICATIONS

This application is a U.S. national phase application of a PCT Application No. PCT/CN2019/080769 filed on Apr. 1, 2019, which claims priority to a Chinese Patent Application No. 201810558433.7 filed on Jun. 1, 2018, the disclosures of which are incorporated in their entirety by reference herein.

TECHNICAL FIELD

The present disclosure relates to the field of display technology, and in particular, relates to a flexible display panel, a method of manufacturing the flexible display panel and a display device.

BACKGROUND

When manufacturing a related flexible display panel, since a flexible film in a bent region of the flexible display panel is not removed completely, an adhesive at the bent region may be squeezed by a flexible display substrate and the flexible film (the flexible display panel is attached to the flexible film) in a case that the flexible display panel is bent. Since the adhesive has a certain fluidity, a wrinkle may be formed at a step place of the flexible film (i.e. a place where a thickness of the flexible film is changed), causing a problem that a risk of breakage at a part of circuitry of the flexible display panel is increased, resulting in a poor display quality.

SUMMARY

A flexible display panel, a method of manufacturing the flexible display panel and a display device are provided by the present disclosure. Technical solutions provided by the present disclosure are specifically described as follows.

In a first aspect, a method of manufacturing a flexible display panel is provided in the present disclosure. The method includes: providing a flexible film, wherein the flexible film includes a first region and a second region other than the first region; forming an adhesive on the second region of the flexible film; attaching a flexible display substrate to the flexible film by using the adhesive; cutting the flexible film to remove at least a portion of the first region of the flexible film, wherein the flexible film is configured to support the flexible display substrate.

Optionally, the first region and the second region are alternately arranged.

Optionally, the flexible display substrate includes a bent region and a non-bent region, and an orthographic projection of the bent region on the flexible film at least partially overlaps the first region.

Optionally, the orthographic projection of the bent region on the flexible film is within the first region, or the orthographic projection of the bent region on the flexible film coincides with the first region, or an orthographic projection of the first region on the flexible display substrate is within the bent region.

Optionally, a symmetry line of the bent region of the flexible display substrate coincides with a symmetry line of the first region.

Optionally, in the case that the orthographic projection of the bent region on the flexible film is within the first region or the orthographic projection of the first region on the flexible display substrate falls into the bent region, a distance between a boundary line of the bent region and a boundary line of the first region is 20-30 um.

Optionally, a cutting line cutting the flexible film coincides with a boundary line between the first region and the second region or is within the first region.

Optionally, an orthographic projection of the flexible display substrate on the flexible film is within the flexible film before cutting the flexible film to remove at least a portion of the first region of the flexible film.

Optionally, cutting the flexible film to remove at least a portion of the first region of the flexible film includes: cutting the flexible film to expose at least a portion of the bent region of the flexible display substrate.

Optionally, the adhesive formed at the second region of the flexible film is spaced apart at the first region.

Optionally, before attaching the flexible display substrate to the flexible film by using the adhesive, the method further includes: providing a rigid carrier plate; forming the flexible display substrate on the rigid carrier plate; and peeling off the flexible display substrate from the rigid carrier plate.

In a second aspect, a flexible display panel is provided in the present disclosure. The flexible display panel includes a flexible display substrate; a flexible film configured to support the flexible display substrate and including a first region and a second region other than the first region; and an adhesive layer between the flexible display substrate and the flexible film, wherein the flexible display substrate is exposed at the first region.

Optionally, the adhesive layer is at a position corresponding to the second region, and the adhesive layer is spaced apart at a position corresponding to at least a portion of the first region.

Optionally, the flexible display substrate includes a bent region and a non-bent region, an orthographic projection of the bent region on the flexible film at least partially overlaps the first region.

Optionally, the orthographic projection of the bent region on the flexible film is within the first region, or the orthographic projection of the bent region on the flexible film coincides with the first region, or an orthographic projection of the first region on the flexible display substrate is within the bent region.

Optionally, a symmetry line of the bent region of the flexible display substrate coincides with a symmetry line of the first region.

Optionally, in the case that the orthographic projection of the bent region on the flexible film is within the first region or the orthographic projection of the first region on the flexible display substrate falls into the bent region, a distance between a boundary line of the bent region and a boundary line of the first region is 20-30 um.

Optionally, an orthographic projection of the flexible film on the flexible display substrate coincides with an orthographic projection of the adhesive layer on the flexible display substrate or covers an orthographic projection of the adhesive layer on the flexible display substrate.

Optionally, an acute angle is formed between an edge, adjacent to an edge of the adhesive layer, of the flexible film and a first plane, the flexible display substrate is in the first plane.

In a third aspect, a display device is provided in the present disclosure. The display device includes the flexible display panel according to the second aspect.

Figure 1A:
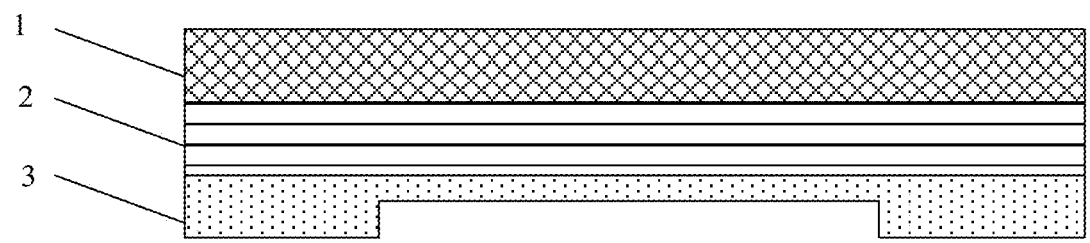
FIG. 1A is a structural schematic view of a related flexible display panel.

REFERENCE NUMERAL 1. flexible display substrate 2. adhesive 3. flexible film 4. laser 100. flexible display panel A. bent region C. non-bent region 1000. rigid carrier plate B. adhesiveless region E. adhesive region

DETAILED DESCRIPTION

In order to make objects, technical solutions and advantages of the embodiments of the present disclosure clearer, the technical solutions of the embodiments of the present disclosure will be clearly and completely described below in conjunction with the drawings and the embodiments of the present disclosure.

Figure 1B:
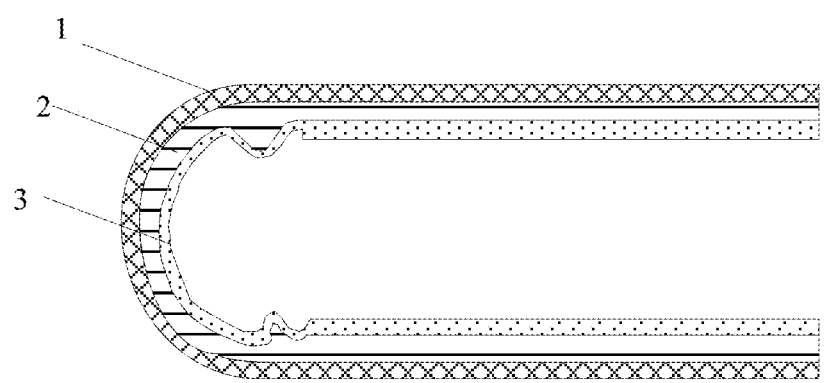
FIG. 1B is a schematic view of a related flexible display panel when the related flexible display panel is bent.
Figure 2:
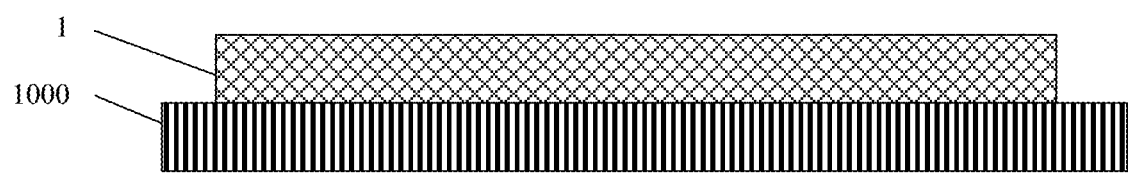
FIG. 2 is a structural schematic view of a rigid carrier plate supporting a manufactured flexible display substrate according to some embodiments of the present disclosure.

In a process of manufacturing a related flexible display panel, a flexible display substrate 1 is attached to a flexible film 3 by an adhesive 2. The flexible film 3 provides a supporting effect to the flexible display substrate 1 with a certain strength. Since the flexible display panel has a bent region, in a related art, a thickness of a portion of the flexible film 3 corresponding to the bent region is reduced by a laser cutting process in order to reduce a stress on a trace in the bent region when the flexible display panel is bent. As shown in FIG. 1, during the laser cutting process, in order to prevent the flexible display panel from being damaged by a shrinkage of the adhesive 2 when being heated by a laser, the portion, corresponding to the bent region, of the flexible film 3 is not removed completely, but is retained to have a thickness of approximately 5 um. Since the portion, corresponding to the bent region, of the flexible film 3 is not completely removed, a portion, corresponding to the bent region, of the adhesive 2 may be squeezed by the flexible display substrate 1 and the flexible film 3 in the case that the flexible display panel is bent. As shown in FIG. 2, since the adhesive has a certain fluidity, a wrinkle may be formed at a step place of the flexible film (i.e. a place where a thickness of the flexible film 2 is changed), causing a problem that a risk of breakage at a part of circuitry of the flexible display panel may be increased, resulting in a poor display quality.

In view of above problems, a flexible display panel, a method of manufacturing the flexible display panel and a display device are provided by the present disclosure, which may improve bending reliability of the flexible display panel.

The method of manufacturing the flexible display panel provided by some embodiments of the present disclosure includes following steps S14-S17.

S14: providing a flexible film 3 and a flexible display substrate 1, wherein the flexible film 3 includes a first region B and a second region E other than the first region B.

S15: forming an adhesive 2 on the second region E of the flexible film 3.

S16: attaching the flexible display substrate 1 to the flexible film 3 by using the adhesive 2, wherein the first region B corresponds to a bent region A of the flexible display panel.

S17: cutting the flexible film 3 to remove at least a portion of the first region B of the flexible film 3.

Figure 3A:
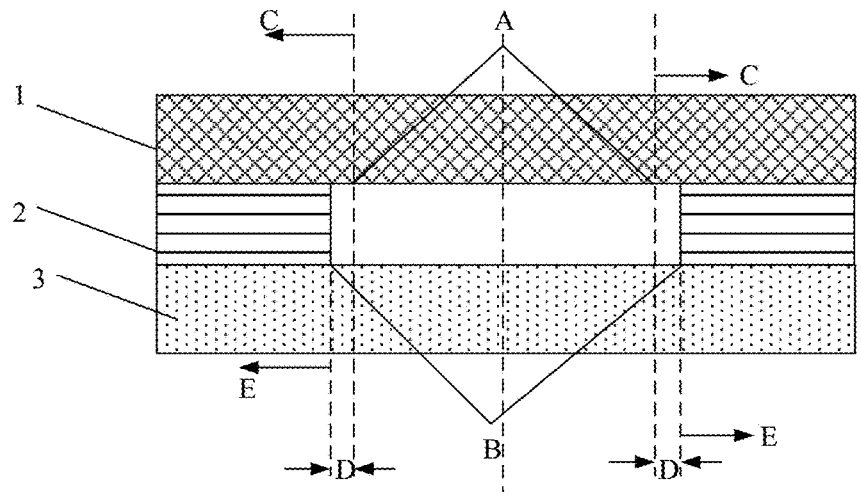
FIG. 3A-3C are schematic views showing a flexible film and a flexible display substrate being attached together according to some embodiments of the present disclosure.
Figure 3B:
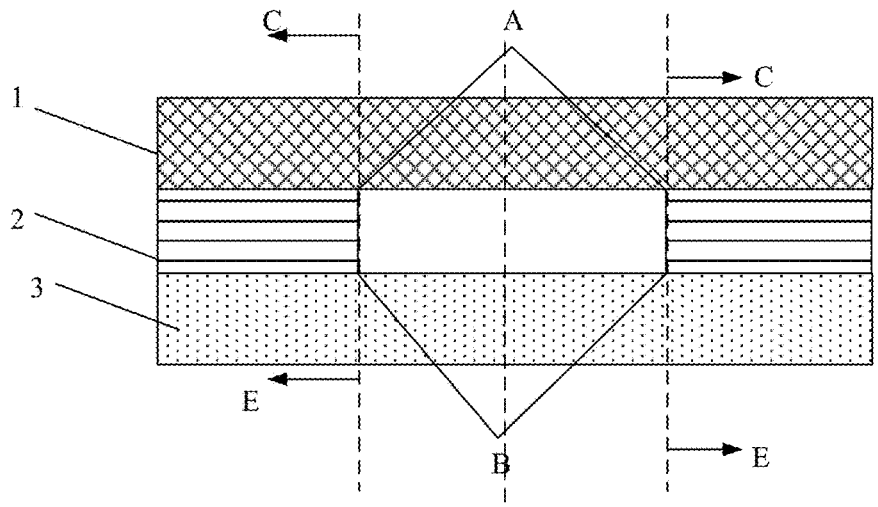
Figure 3C:
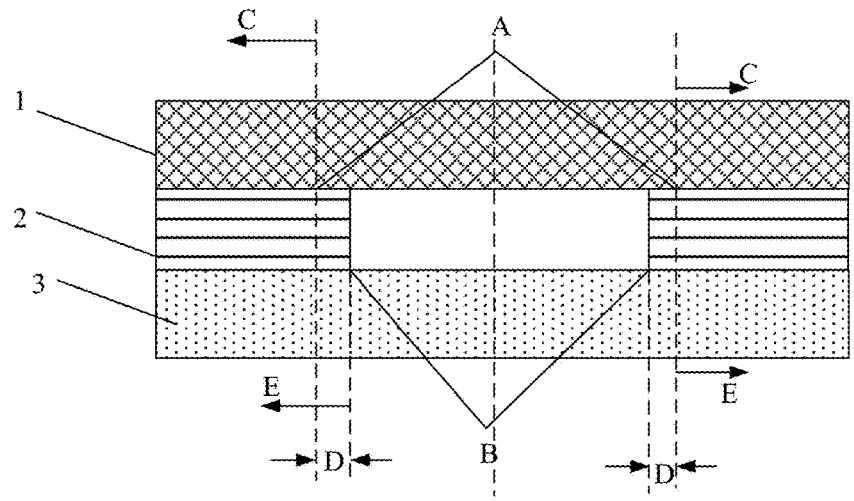

The flexible display panel 100 includes the bent region A and a non-bent region C. The first region B is an adhesiveless region and a symmetry line of the first region B coincides with a symmetry line of the bent region A. As shown in FIG. 3B, an area of the first region B may be equal to an area of the bent region A, that is, in a case that the flexible display panel is not bent, an orthographic projection of the bent region A of the flexible display substrate 1 on the flexible film 3 coincides with that of the first region B on the flexible film 3. As shown in FIG. 3A, the area of the first region B may also be slightly larger than the area of the bent region A, that is, in the case that the flexible display panel is not bent, an orthographic projection of the bent region A of the flexible display substrate 1 on the flexible film 3 falls into that of the first region B on the flexible display substrate 1. As shown in FIG. 3C, the area of the first region B may also be slightly smaller than the area of the bent region A, that is, in the case that the flexible display panel is not bent, an orthographic projection of the first region B on the flexible display substrate 1 falls into that of the bent region A on the flexible display substrate 1.

Since there is no adhesive or there is a few adhesive at a position corresponding to the bent region of the flexible display substrate, the wrinkle at the bent region caused by flowing of the adhesive 2 may be effectively eliminated in the case that the flexible display panel is bent, thereby reducing a risk of breakage of a trace of the flexible display panel, improving the bending reliability of the flexible display panel and a durability of a product.

Further, before the step S14 of the providing the flexible film 3 and the flexible display substrate 1, the method further includes steps S11-S13.

S11: providing a rigid carrier plate 1000;

S12: forming the flexible display substrate 1 on the rigid carrier plate 1000; and S13: peeling off the flexible display substrate 1 from the rigid carrier plate 1000.

Since a carrier is needed to manufacture the flexible display substrate 1, firstly it is necessary to manufacture the flexible display substrate 1 on the rigid carrier plate 1000 and then peel off the flexible display substrate 1 from the rigid carrier plate 1000 and then attach the flexible display substrate 1 with the flexible film 3.

Optionally, as shown in FIG. 3A, the orthographic projection of the bent region A of the flexible display substrate 1 on the flexible film 3 is within that of the first region B on the flexible film; or the orthographic projection of the bent region A of the flexible display substrate 1 on the flexible film 3 coincides with that of the first region B on the flexible film 3. In other words, since there is no adhesive at a position corresponding to the bent region A, the wrinkle of the bent region may be effectively eliminated in the case that the flexible display panel is bent, wherein the wrinkle of the bent region is caused by the flowing of the adhesive 2 when the bending of the flexible display substrate 1 and the flexible film 3 causes a squeeze force to the adhesive 2. Thus, the risk of the breakage of the trace of the flexible display panel may be reduced, thereby improving the bending reliability of the flexible display panel and the durability of the product.

Optionally, the adhesiveless region (i.e., the first region B) is slightly larger than the bent region A in size, a distance D between an outermost boundary line of the bent region A and an outermost boundary line of the first region B may be 20-30 um. Thus, in the case that the flexible display panel is bent, an influence of the adhesive 2 on the bending of the flexible display panel may be completely eliminated; the wrinkle of the bent region caused by the flowing of the adhesive 2 may be eliminated, wherein the flowing of the adhesive 2 is caused by the squeeze force applied to the adhesive 2 due to the bending of the flexible display substrate 1 and the flexible film 3. Thus, the risk of the breakage of the trace of the flexible display panel may be reduced, thereby improving the bending reliability of the flexible display panel and the durability of the product.

Figure 5:
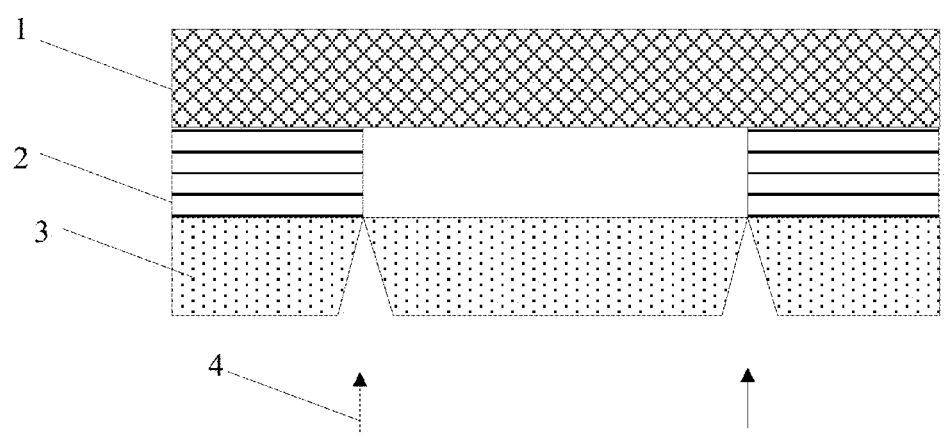
FIG. 5 is a schematic view showing that a portion of a flexible film corresponding to a bent region is removed according to some embodiments of the present disclosure.
Figure 6:
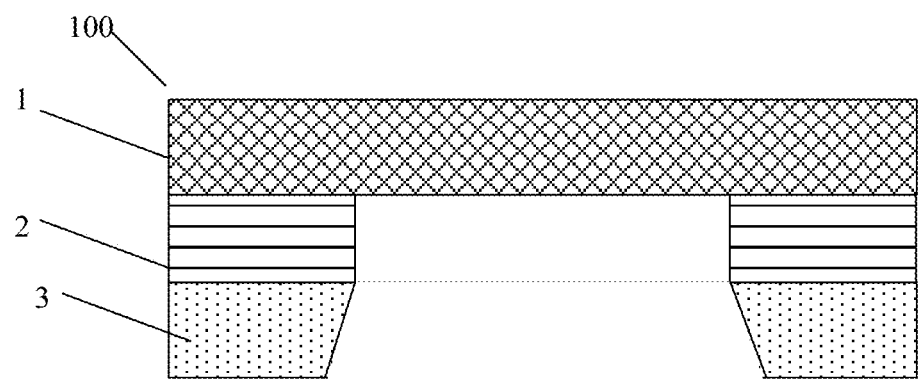
FIG. 6 is a schematic view showing that a portion of a flexible film corresponding to an adhesiveless region automatically peels off according to some embodiments of the present disclosure.

Optionally, as shown in FIG. 5 and FIG. 6, a cutting line cutting the flexible film 3 coincides with a boundary line between the first region B and the second region E or is within the first region. In other words, there is no adhesive 2 at a cutting position where the flexible film 3 is cut, which may improve a cutting efficiency and further improve a production efficiency.

Optionally, the orthographic projection of the flexible display substrate 1 on the flexible film 3 is within the flexible film 3 before the flexible film 3 is cut. In other words, when the flexible display substrate 1 is attached with the flexible film 3, an entirety of the flexible film 3 is attached to the flexible display substrate 1. Compared with a case in the related art that the plurality of flexible films 3 are attached to the flexible display substrate 1, an attaching tolerance may be effectively reduced and a product yield may be improved.

Some embodiments also provide a flexible display panel 100 which is manufactured by the method of manufacturing as described above.

In the flexible display panel provided by the present disclosure, since there is no adhesive or there is a few adhesive at a position corresponding to the bent region, in the case that the flexible display panel is bent, the wrinkle of the bent region may be effectively eliminated, wherein the wrinkle of the bent region is caused by the flowing of the adhesive 2 when the bending of the flexible display substrate and the flexible film causes a squeeze force to the adhesive. Thus, the risk of the breakage of the trace of the flexible display panel may be reduced, thereby improving the bending reliability of the flexible display panel and the durability of the product.

The flexible display panel includes the bent region A and the non-bent region C. The adhesive 2 is in the non-bent region C. There is no adhesive at the position corresponding to the bent region A or there is no adhesive at at least a part of the position corresponding to the bent region A. Thus, in the case that the flexible display panel 100 is bent, the wrinkle of the bent region may be effectively eliminated in the case that the flexible display panel is bent, wherein the wrinkle of the bent region is caused by the flowing of the adhesive 2 when the bending of the flexible display substrate 1 and the flexible film 3 causes a squeeze force to the adhesive 2. Thus, the risk of the breakage of the trace of the flexible display panel may be reduced, thereby improving the bending reliability of the flexible display panel 100 and the durability of the product.

Optionally, the adhesiveless region (i.e., the first region B) is slightly larger than the bent region A in size, a distance between a boundary line of adhesive 2 and a boundary line of the bent region A may be 20-30 um. Thus, in the case that the flexible display panel 100 is bent, an influence of the adhesive 2 on the bending of the flexible display panel may be completely avoided; the wrinkle of the bent region A may be effectively eliminated, wherein the wrinkle of the bent region is caused by the flowing of the adhesive 2 when the bending of the flexible display substrate 1 and the flexible film 3 causes a squeeze force to the adhesive 2. Thus, the risk of the breakage of the trace of the flexible display panel may be reduced, thereby improving the bending reliability of the flexible display panel and the durability of the product.

Optionally, the orthographic projection of the flexible film 3 on the flexible display substrate 1 is within that of the non-bent region C on the flexible display substrate. In other words, the flexible film 3 is not provided in the bent region A. Thus, in the case that the flexible display panel is bent, the trace at the bent region A may be in a neutral layer without being affected by a force.

Of course, the orthographic projection of the flexible film 3 on the flexible display substrate 1 may also cover a part of the bent region A. Since the portion, corresponding to the bent region A, of the flexible film 3 has been partially removed, portions, beyond the bent region A, of the flexible film 3 cannot form an integral portion. Thus, in the case that the flexible display panel 100 is bent, a stress applied to the trace at the bent region A may also be reduced.

The display device provided by some embodiments of the present disclosure includes the flexible display panel as described above. The display device may be any product or component having a display function, such as a television, a display screen, a digital photo frame, a mobile phone, a tablet computer or the like. The display device also includes a flexible circuit board, a printed circuit board and a back plate.

The technical solutions of the present disclosure will be described in detail below with reference to the drawings and the specific embodiments. The method of manufacturing the flexible display panel provided by the present disclosure includes the following steps:

Step S1: providing a rigid carrier plate 1000; after forming the flexible display substrate 1 on the rigid carrier plate 1000, peeling the flexible display substrate 1 off the rigid carrier plate 1000.

As shown in FIG. 2, the rigid carrier plate 1000 may be a quartz substrate or a glass substrate. A flexible base and a display element on the flexible base may be sequentially manufactured on the rigid carrier plate 1000, and the flexible base is peeled off the rigid carrier plate 1000 using a laser peeling-off technique to obtain the flexible display substrate 1 including the flexible base and the display element. The flexible base may be made of a polyimide film. The display element includes a driving thin film transistor and a light-emitting unit, and the light-emitting unit includes an anode, a cathode and an organic light-emitting layer. Since a thickness of the flexible display substrate 1 is relatively thin, generally about 30 μm, the flexible display substrate 1 needs to be attached to the flexible film 3, and the flexible film 3 is used to provide supporting to the flexible display substrate 1 to some extent.

Step S2: providing the flexible film 3, coating the adhesive 2 on the flexible film 3.

The flexible film 3 may be made of polyethylene terephthalate (PET). Of course, the flexible film 3 is not limited to the PET, and other organic films having a certain flexibility may also be used. The adhesive 2 is coated on different regions of the flexible film 3. A position corresponding to the first region B of the flexible film 3 is not coated with the adhesive. An orthographic projection of the bent region A of the flexible display substrate 1 on the flexible film 3 is within a boundary line of the first region B of the flexible film 3 or coincides with the first region B of the flexible film 3; or the orthographic projection of the first region B on the flexible display substrate 1 is within the bent region A of the flexible display substrate 1.

Step S3: as shown in FIG. 3A-3C, attaching the flexible film and the flexible display substrate together.

The orthographic projection of the flexible display substrate 1 on the flexible film 3 is within the flexible film 3. In other words, when the flexible display substrate 1 is attached with the flexible film 3, an entirety of the flexible film 3 is attached to the flexible display substrate. Compared with a case in the related art that the plurality of flexible films are attached to the flexible display substrate 1, an attaching tolerance may be effectively reduced and a product yield may be improved.

As shown in FIG. 3A, a symmetrical center line of the adhesiveless region B coincides with a symmetrical center line of the bent region A, and the adhesiveless region B may be slightly larger than the bent region A. For example, in the case that the adhesiveless region B is slightly larger than the bent region A, the distance D between the boundary line of the adhesiveless region B and the boundary line of the bent region A may be 20-30 um, such as 25 um. As shown in 3B, the symmetrical center line of the adhesiveless region B coincides with the symmetrical center line of the bent region A, and the orthographic projection of the adhesiveless region B on the flexible display substrate 1 coincides with the bent region A. As shown in 3C, the symmetrical center line of the adhesiveless region B coincides with the symmetrical center line of the bent region A, and the orthographic projection of the adhesiveless region B on the flexible display substrate 1 is within the bent region A.

Figure 4:
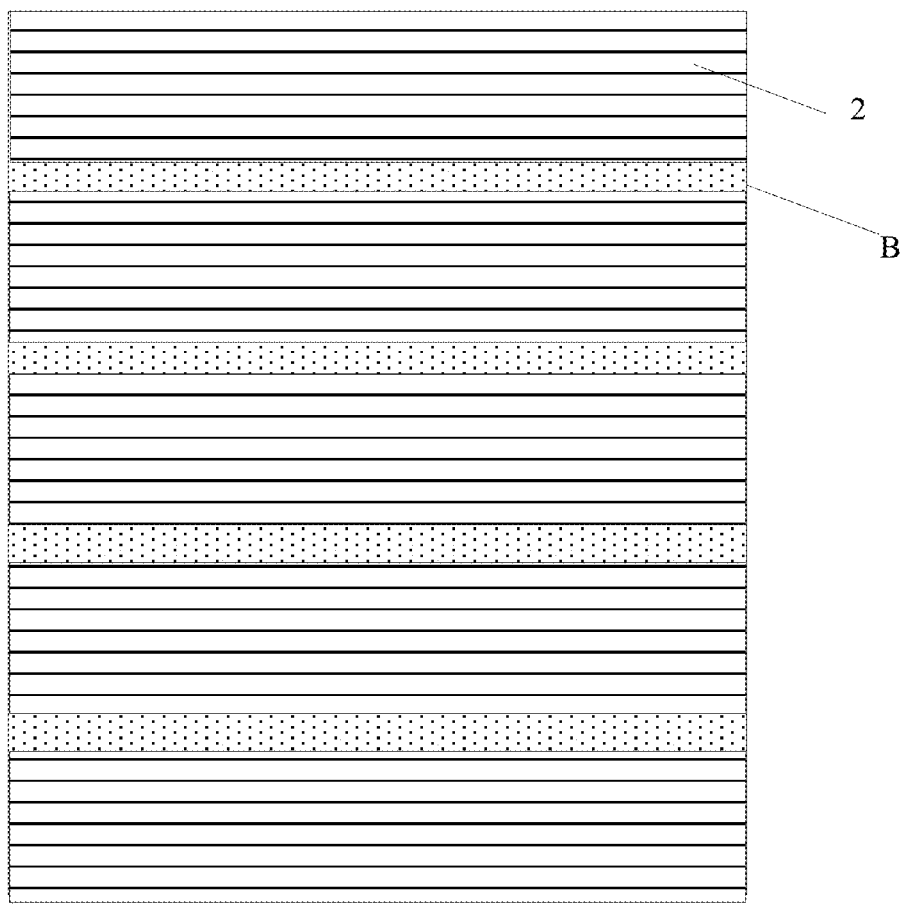
FIG. 4 is a distribution schematic view of an adhesive region and an adhesiveless region according to some embodiments of the present disclosure.

As shown in FIG. 4, FIG. 4 shows a schematic view of planar distribution of an adhesive region (i.e. the second region E) and the adhesiveless region (i.e. the first region B). It may be seen that the adhesiveless region B exists in the portion, corresponding to the bent region A, of the flexible film 3. After the flexible film 3 is attached to the flexible display substrate 1, since the adhesive is not applied at the position corresponding to the bent region A, the wrinkle of the bent region A may be effectively eliminated in the case that the flexible display panel is bent, wherein the wrinkle of the bent region A is caused by the flowing of the adhesive 2 when the bending of the flexible display substrate 1 and the flexible film 3 causes a squeeze force to the adhesive 2.

In the case that a plurality of display elements are formed on the flexible display substrate 1, after an attachment is completed, the flexible display substrate 1, the adhesive 2 and the flexible film 3 may be cut along a cutting line between display elements, thereby obtaining a plurality of independent flexible display panels.

Step S4: removing a portion, corresponding to the bent region A, of the flexible film 3.

As shown in FIG. 5, before the flexible display panel 100 is bent, it is necessary to remove the portion, corresponding to the bent region A, of the flexible film 3. As shown in FIG. 6, the flexible film 3 may be cut directly along a boundary line between an adhesive region E and an adhesiveless region B by using a laser 4. After the flexible film 3 is cut along the boundary line as described above, the portion, corresponding the adhesiveless region B, of the flexible film 3 is automatically peeled off, and a part of the flexible film 3 is completed removed. Compared with a related laser-scanning type for burning off the flexible film, a residual of the flexible film and a residual of impurity particles caused by burning may be reduced, and a part, corresponding to the bent region A, of the flexible film 3 may be completely removed and a laser-cutting efficiency is improved, which is beneficial to improve a production efficiency of a display product and reduce a production cost of a display product.

Figure 7:
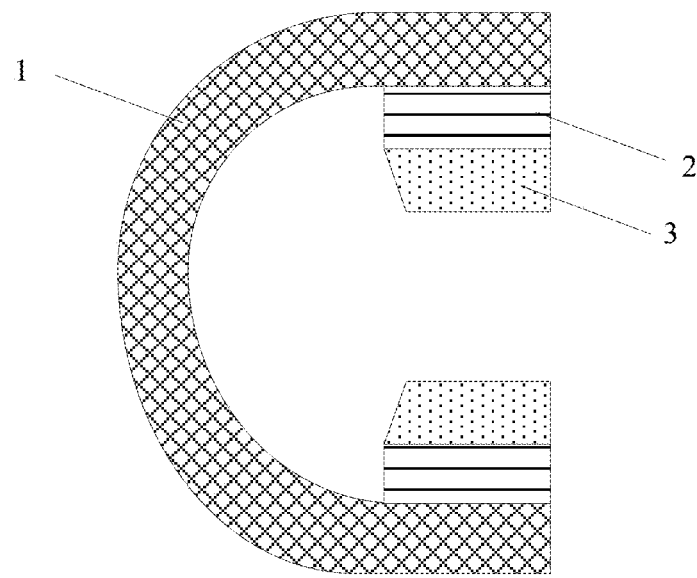
FIG. 7 is a schematic view of a flexible display panel when the flexible display panel is bent according to some embodiments of the present disclosure.

FIG. 7 shows the flexible display panel 100 after the flexible display panel 100 is bent. According to the embodiments of the present disclosure, the wrinkle of the bent region may be effectively eliminated, wherein the wrinkle of the bent region is caused by the flowing of the adhesive 2 when the bending of the flexible display substrate 1 and the flexible film 3 causes a squeeze force to the adhesive 2. Thus, the risk of the breakage of the trace of the flexible display panel may be reduced, thereby improving the bending reliability of the flexible display panel and the durability of the product.

Figure 8:
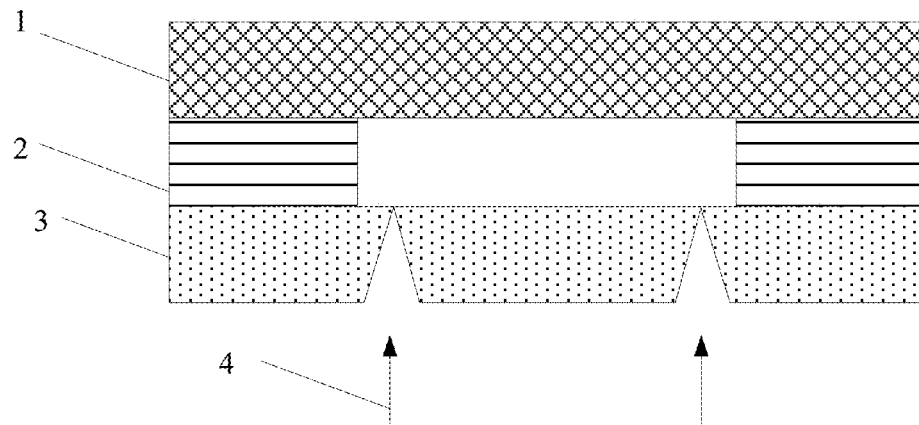
FIG. 8 is another schematic view showing that a portion of a flexible film corresponding to a bent region is removed according to some embodiments of the present disclosure.
Figure 9:
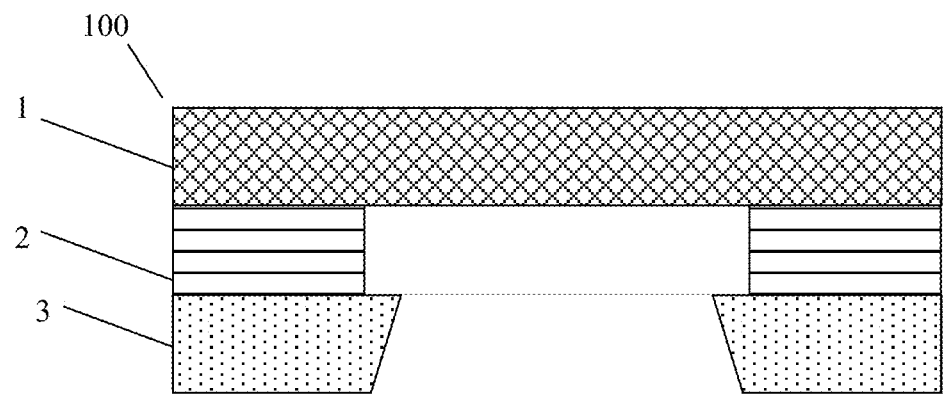
FIG. 9 is another schematic view showing that a portion of a flexible film corresponding to an adhesiveless region automatically peels off according to some embodiments of the present disclosure.
Figure 10:
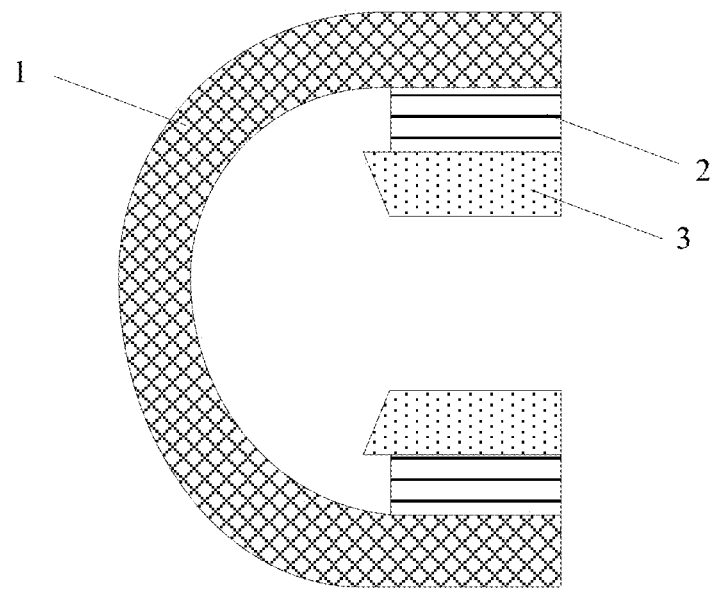
FIG. 10 is a schematic view of a flexible display panel when the flexible display panel is bent according to some embodiments of the present disclosure.
Figure 11:
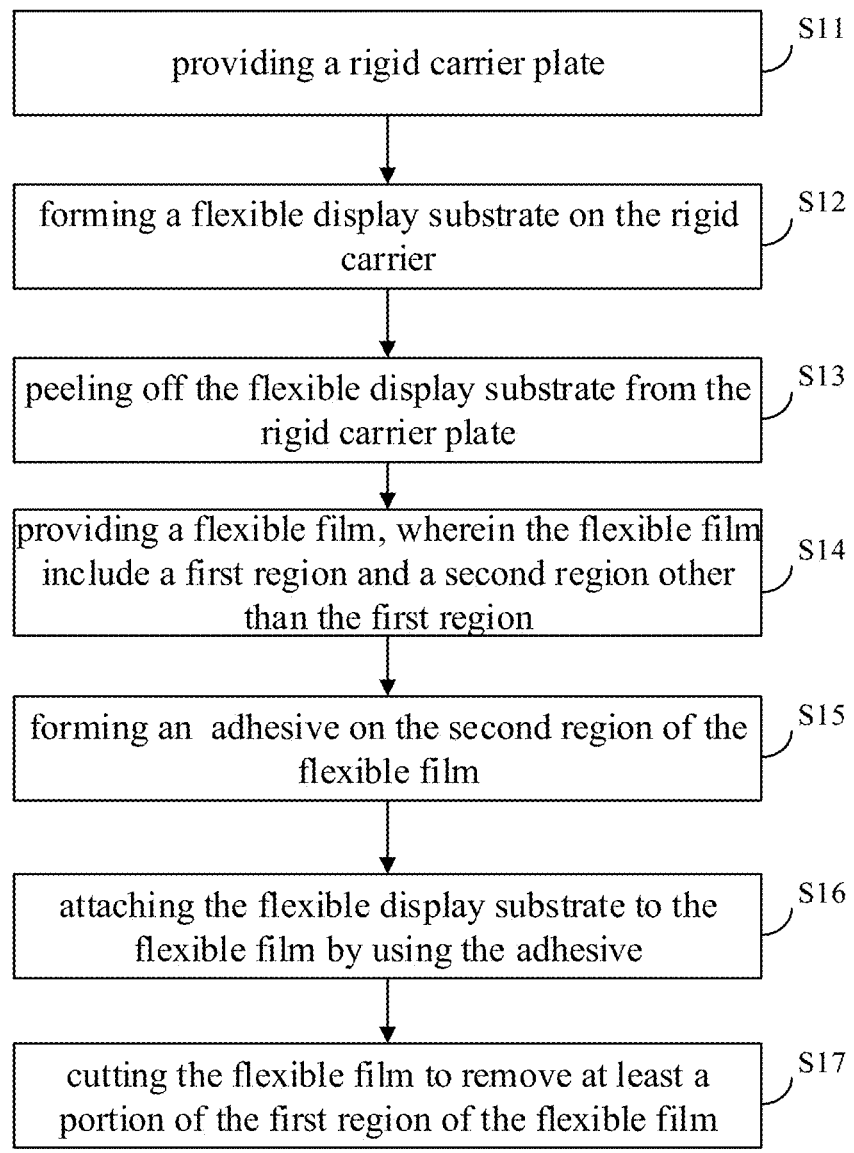
FIG. 11 is a flow chart of a method of manufacturing a flexible display panel according to some embodiments of the present disclosure.

In the above embodiments, a cutting line for cutting the flexible film 3 is at a boundary line between an adhesive region E and the adhesiveless region B. In addition, as shown in FIG. 8, a cutting line for cutting the flexible film 3 may also be in the adhesiveless region B; and as shown in FIG. 9, the flexible film 3 is cut along the cutting line in the adhesiveless region B. After the flexible film 3 is cut, a portion, inside the cutting line in the adhesiveless region B, of the flexible film 3 is automatically peeled off., and the portion of the flexible film 3 is completely removed. Compared with the related laser-scanning type for burning off the flexible film, a residual of the flexible film and a residual of impurity particles caused by burning may be reduced, and a part, corresponding to the bent region A, of the flexible film 3 may be completely removed and a laser-cutting efficiency is improved, which is beneficial to improve a production efficiency of a display product and reduce a production cost of a display product. FIG. 10 shows the flexible display panel after the flexible display panel 100 is bent. According to the embodiments of the present disclosure, the wrinkle of the bent region may be effectively eliminated, wherein the wrinkle of the bent region is caused by the flowing of the adhesive 2 when the bending of the flexible display substrate 1 and the flexible film 3 causes a squeeze force to the adhesive 2. Thus, the risk of the breakage of the trace of the flexible display panel may be reduced, thereby improving the bending reliability of the flexible display panel and the durability of the product.

In some embodiments of the disclosure, since there is no adhesive 2 or there is a few adhesive 2 in the bent region A, the wrinkle of the bent region caused by the flowing of the adhesive 2 may be effectively eliminated in the case that the flexible display panel is bent, wherein the flowing of the adhesive 2 is caused by the squeeze force applied to the adhesive 2 due to the bending of the flexible display substrate 1 and the flexible film 3. Thus, the risk of the breakage of the trace of the flexible display panel may be reduced, thereby improving the bending reliability of the flexible display panel and the durability of the product.

In the embodiments of the present disclosure, numbering of the steps does not necessarily define an order of the steps. A variation of the order of the steps also falls into the protection scope of the present disclosure for one of ordinary skills in the art without paying creative work.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "comprising" and the like mean that an element or an article preceding the term contains elements or items and equivalents thereof behind the term, but does not exclude other elements or items. Such terms as "connect", or "interconnected" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A method of manufacturing a flexible display panel, comprising:
   providing a flexible film, wherein the flexible film comprises a first region and a second region other than the first region;
   forming an adhesive on the second region of the flexible film;
   attaching a flexible display substrate to the flexible film by using the adhesive;
   cutting the flexible film to remove at least a portion of the first region of the flexible film, wherein the flexible film is configured to support the flexible display substrate,
   wherein the flexible display substrate comprises a bent region and a non-bent region,
   wherein an orthographic projection of the bent region on the flexible film is within the first region, or an orthographic projection of the first region on the flexible display substrate is within the bent region, and
   wherein a distance between a boundary line of the bent region and a boundary line of the first region is 20-30 um.

2. The method of manufacturing the flexible display panel according to claim 1, wherein the first region and the second region are alternately arranged.

3. The method of manufacturing the flexible display panel according to claim 1, wherein a symmetry line of the bent region of the flexible display substrate coincides with a symmetry line of the first region.

4. The method of manufacturing the flexible display panel according to claim 1, wherein a cutting line cutting the flexible film is within the first region.

5. The method of manufacturing the flexible display panel according to claim 1, wherein an orthographic projection of the flexible display substrate on the flexible film is within the flexible film before cutting the flexible film to remove at least a portion of the first region of the flexible film.

6. The method of manufacturing the flexible display panel according to claim 1, wherein cutting the flexible film to remove at least a portion of the first region of the flexible film comprises:
   cutting the flexible film to expose at least a portion of the bent region of the flexible display substrate.

7. The method of manufacturing the flexible display panel according to claim 1, wherein
   the adhesive formed at the second region of the flexible film is spaced apart at the first region.

8. The method of manufacturing the flexible display panel according to claim 1, wherein before attaching the flexible display substrate to the flexible film by using the adhesive, the method further comprises:
   providing a rigid carrier plate;
   forming the flexible display substrate on the rigid carrier plate; and
   peeling off the flexible display substrate from the rigid carrier plate.

9. A flexible display panel, comprising:
   a flexible display substrate;
   a flexible film configured to support the flexible display substrate and comprising a first region and a second region other than the first region; and
   an adhesive layer between the flexible display substrate and the flexible film,
   wherein the flexible display substrate is exposed at the first region,
   wherein the flexible display substrate comprises a bent region and a non-bent region,
   wherein an orthographic projection of the bent region on the flexible film is within the first region, or an orthographic projection of the first region on the flexible display substrate is within the bent region, and
   wherein a distance between a boundary line of the bent region and a boundary line of the first region is 20-30 um.

10. The flexible display panel according to claim 9, wherein the adhesive layer is at a position corresponding to the second region, and the adhesive layer is spaced apart at a position corresponding to at least a portion of the first region.

11. The flexible display panel according to claim 9, wherein a symmetry line of the bent region of the flexible display substrate coincides with a symmetry line of the first region.

12. The flexible display panel according to claim 9, wherein an orthographic projection of the flexible film on the flexible display substrate coincides with an orthographic projection of the adhesive layer on the flexible display substrate or covers an orthographic projection of the adhesive layer on the flexible display substrate.

13. The flexible display panel according to claim 12, wherein an acute angle is formed between an edge, adjacent to an edge of the adhesive layer, of the flexible film and a first plane, the flexible display substrate is in the first plane.

14. A display device, comprising:
the flexible display panel according to claim 9.

* * * * *